(12) United States Patent
Wilcox et al.

(10) Patent No.: US 9,433,124 B2
(45) Date of Patent: Aug. 30, 2016

(54) REVERSIBLE FAN MODULE

(71) Applicant: Arista Networks, Inc., Santa Clara, CA (US)

(72) Inventors: Robert Wilcox, Santa Clara, CA (US); Richard Hibbs, Santa Clara, CA (US); Jiayi Wu, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 67 days.

(21) Appl. No.: 14/549,945

(22) Filed: Nov. 21, 2014

(65) Prior Publication Data
US 2016/0150675 A1    May 26, 2016

(51) Int. Cl.
*H05K 7/20* (2006.01)
*H05K 7/14* (2006.01)
*H01L 23/473* (2006.01)

(52) U.S. Cl.
CPC ............ *H05K 7/20145* (2013.01); *H05K 7/14* (2013.01)

(58) Field of Classification Search
CPC .............................. G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 6,185,097 B1* | 2/2001 | Behl | ........................ | G06F 1/20 361/695 |
| 6,213,866 B1* | 4/2001 | Impellizzeri | ....... | H05K 7/20136 165/80.2 |
| 7,729,116 B1* | 6/2010 | Aybay | ................ | H05K 7/20736 312/236 |
| 7,983,039 B1* | 7/2011 | Nguyen | ............. | H05K 7/20727 361/694 |
| 8,320,120 B1* | 11/2012 | Chan | ................... | H05K 7/20727 165/121 |
| 8,493,732 B2* | 7/2013 | Lineal | .................... | A47B 23/04 361/679.48 |
| 8,582,294 B2* | 11/2013 | Guerin | .................... | H01G 2/04 320/107 |

(Continued)

*Primary Examiner* — Anthony Haughton
*Assistant Examiner* — Razmeen Gafur
(74) *Attorney, Agent, or Firm* — Osha Liang LLP (57) ABSTRACT

A system may include a reversible fan module that creates an airflow. The reversible fan module may include a set of attachment members, disposed on a face of the reversible fan module, that secure the reversible fan module a first orientation or a second orientation. The system may further include a chassis that include a divider that divides an interior region of the chassis into a front compartment and a rear compartment, a window, disposed on the divider, that allows airflow between the front compartment and the rear compartment, a first opening in the chassis that opens the front compartment to a first external region, a second opening in the chassis that opens the rear compartment to a second external region, and a bay that receives the reversible fan module.

11 Claims, 9 Drawing Sheets

(56) References Cited

U.S. PATENT DOCUMENTS

| Publication No. | Date | Name | Classification | Subclass |
|---|---|---|---|---|
| 2004/0223301 A1* | 11/2004 | Muller | H05K 7/20909 | 361/699 |
| 2011/0014861 A1* | 1/2011 | Tsai | G06F 1/20 | 454/184 |
| 2011/0076932 A1* | 3/2011 | Li | G06F 1/183 | 454/184 |
| 2011/0103011 A1* | 5/2011 | Koplow | F04D 25/0606 | 361/679.54 |
| 2011/0250831 A1* | 10/2011 | Huang | H05K 7/20745 | 454/184 |
| 2012/0034860 A1* | 2/2012 | Okada | G06F 1/206 | 454/184 |
| 2012/0071076 A1* | 3/2012 | Wei | H05K 7/1497 | 454/184 |
| 2012/0224325 A1* | 9/2012 | Sun | H05K 7/20145 | 361/695 |
| 2012/0302150 A1* | 11/2012 | Schmitt | H05K 7/20745 | 454/184 |
| 2013/0140968 A1* | 6/2013 | Nagahori | H05K 7/20563 | 312/223.1 |
| 2013/0168065 A1* | 7/2013 | Sun | H05K 7/20172 | 165/122 |
| 2013/0188309 A1* | 7/2013 | Ross | H05K 7/20727 | 361/679.48 |
| 2013/0188313 A1* | 7/2013 | Dede | H05K 7/20172 | 361/695 |
| 2013/0210334 A1* | 8/2013 | Tan | H05K 7/20727 | 454/184 |
| 2013/0231038 A1* | 9/2013 | Chang | H05K 7/20745 | 454/184 |
| 2013/0278120 A1* | 10/2013 | Elkins | H05K 5/0213 | 312/236 |
| 2013/0295834 A1* | 11/2013 | Faist | H05K 7/20736 | 454/184 |
| 2013/0324025 A1* | 12/2013 | Peng | G06F 1/20 | 454/184 |

* cited by examiner

REVERSIBLE FAN MODULE

BACKGROUND

Electronic components generate heat and sometimes require active cooling such as an airflow generated by a fan. When electronic components are grouped closely together, the quantity of heat generated by the electronic components is sometimes sufficient to increase the temperature of the environment surrounding the electronic components. Further, in many cases, groups of electronic components are housed in structures that trap hot air around the electronic components which further increases the temperature of the environment around the electronic components.

SUMMARY

In one aspect, a system according to one or more embodiments may include a reversible fan module that creates an airflow. The reversible fan module may include a set of attachment members, disposed on a face of the reversible fan module, adapted to secure the reversible fan module in a first orientation or a second orientation. The system may further include a chassis that include a divider that divides an interior region of the chassis into a front compartment and a rear compartment, a window, disposed on the divider, that allows airflow between the front compartment and the rear compartment, a first opening in the chassis that opens the front compartment to a first external region, a second opening in the chassis that opens the rear compartment to a second external region, a bay adapted to receive the reversible fan module, a first power supply module, disposed in the rear compartment, adapted to be cooled by at least one selected from a group consisting of a forward airflow and a reverse air flow, a second power supply module, disposed in the rear compartment, adapted to be cooled by at least one selected from a group consisting of a forward airflow and a reverse air flow, and a set of attachment receptacles adapted to mate with the set of attachment members. When the reversible fan module is received in a first orientation, the forward airflow is directed into the first opening, through the front compartment, into the rear compartment, through the second power supply module, through the reversible fan module, through the second power supply module, and out of the second opening. When the reversible fan module is received in the second orientation, the reverse airflow is directed into the second opening, into the rear compartment, through the first power supply module, through the reversible fan module, through the second power supply module, into the front compartment, and out of the first opening.

In one aspect, a method according to one or more embodiments may include inserting a reversible fan module in a first orientation in a bay of a chassis including a single airflow path, activating the reversible fan module when the reversible fan module is in the first orientation, and causing, by the activated reversible fan module in the first orientation, a forward airflow in a first direction along a single airflow path. The forward airflow cools at least one power supply module that supplies power to the reversible fan module. The method may further include removing the reversible fan module from the bay, inserting the reversible fan module in a second orientation in the bay, activating the reversible fan module when the reversible fan module is in the second orientation, and causing, by the activated reversible fan module in the second orientation, a reverse airflow in a second direction along the single airflow path. The reverse airflow cools at least one power supply module that supplies power to the reversible fan module.

In one aspect, a reversible fan module according to one or more embodiments may include a set of attachment members, disposed on a face of the reversible fan module, adapted to secure the reversible fan module in one selected from a group consisting of a first orientation and a second orientation, at least two fan units that cause a forward airflow when the reversible fan module is in the first orientation and a reverse airflow when the reversible fan module is in the second orientation, a sub-air channel associated with one of the at least two fan units, and an airflow activated closing element that closes the sub-air channel in response to a counter airflow.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

Embodiments of the invention include a system relating to controlling airflow and cooling within a chassis. In one or more embodiments of the invention, the chassis is part of a network switch or other electronic device located in a server farm or high density computing environment. In one or more embodiments of the invention, the system includes a reversible fan module and a chassis that controls airflow and cooling within a network switch or other electronic device. In one or more embodiments of the invention, the chassis includes a first opening and a second opening that are designed to take in cool air and exhaust hot air respectively, or the reverse. In one or more embodiments of the invention, the reversible fan module may reverse the flow of air within the chassis by changing the orientation of the reversible fan module.

Further, embodiments of the invention may take the form of methods of changing the direction of airflow within a chassis. The method may include inserting a reversible fan module in a first orientation, activating the reversible fan module, creating a forward airflow, and cooling at least one power supply. The method may also include removing the reversible fan module, inserting the reversible fan module in a second orientation, activating the reversible fan module in the second orientation, creating a reverse air flow, and cooling at least one power supply.

Figure 1:
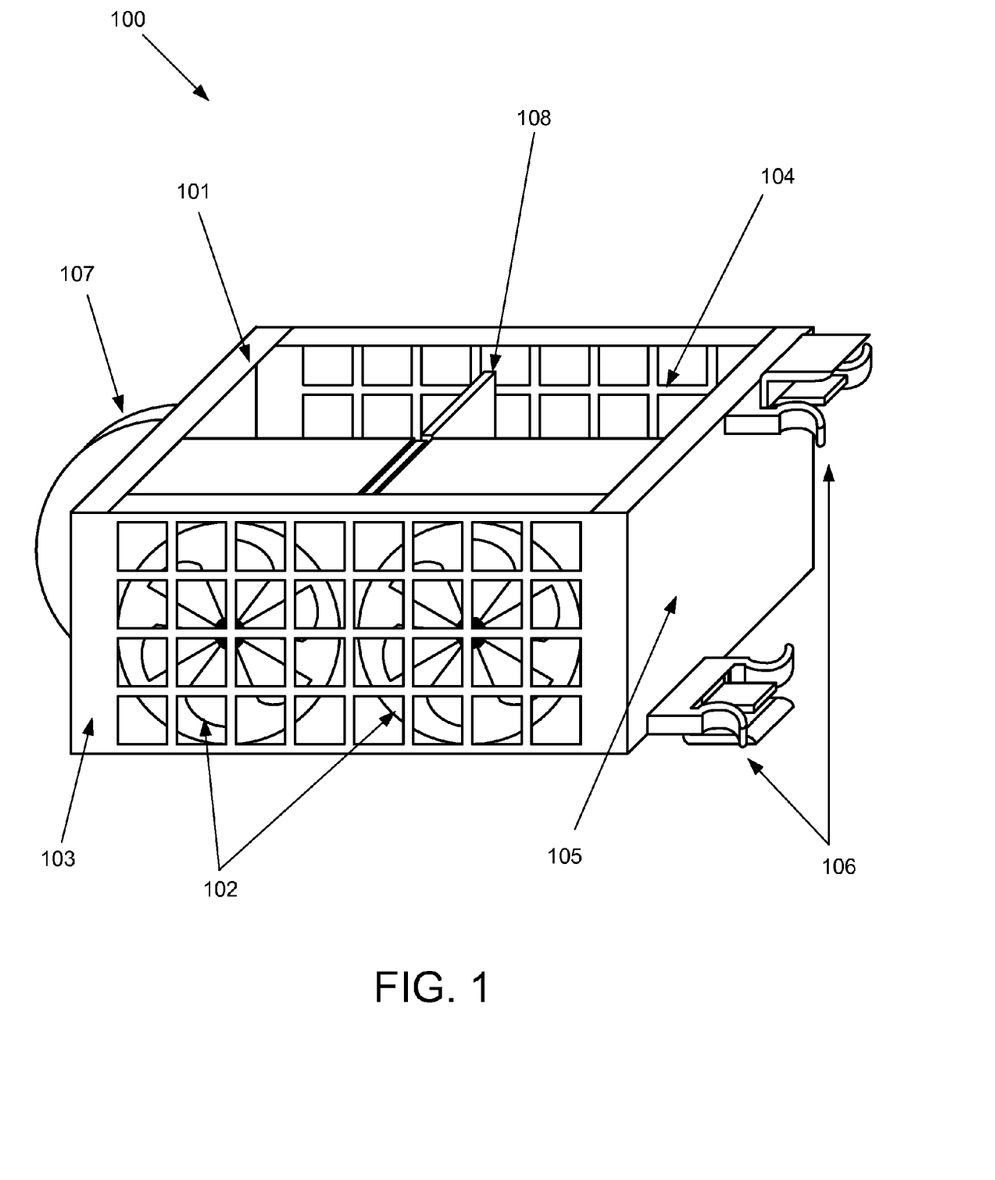
FIG. 1 shows a reversible fan module in accordance with one or more embodiments.

FIG. 1 shows an isometric view of a reversible fan module (100) according to one or more embodiments of the invention. The reversible fan module (100) includes a housing (101) and at least one fan unit (102) within the housing (101). When active, the fan units (102) cause an airflow into a front side (103) of the housing (101), through the housing (101), and out of a rear side (104) of the housing. The front side (103) and rear side (104) include a grating or screening element to allow airflow while preventing debris or other objects from entering the housing (101).

The reversible fan module (100) also includes at least one attachment member (106) disposed on a side face (105) of the reversible fan module (100). The attachment members (106) are adapted to be received by attachment receptacles to position and orient the reversible fan module (100) in a predetermined location. In one or more embodiments, two attachment members (106) are disposed on the side face (105) to enable positioning and orienting of the reversible fan module (100) during a reversal process. The attachment members (106), when mated to the attachment receptacles (613 in FIG. 6), enable power at least one of the power supplies (701, 702 in FIG. 7) to be provided to the reversible fan module (100).

Figure 2A:
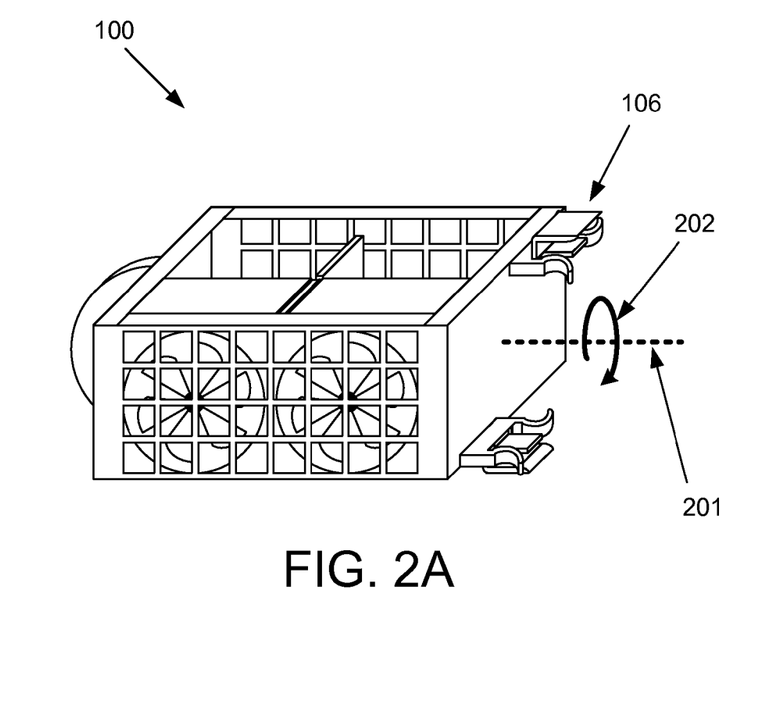
FIGS. 2A-B show a reversible fan module in accordance with one or more embodiments.
Figure 2B:
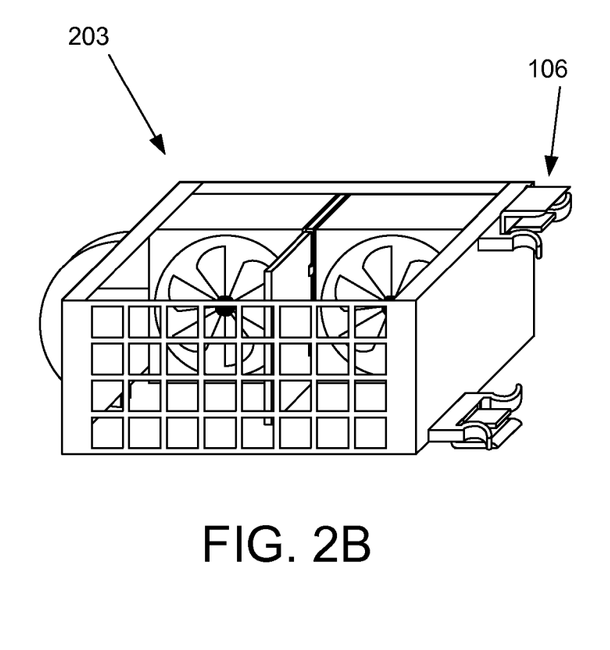

FIG. 2 shows a reversal process in accordance with one or more embodiments. Specifically, FIG. 2A shows a reversible fan module (100) before being reversed and FIG. 2B shows a reversible fan module (100) after being reversed. The reversible fan module (100) is reversed by rotating (202) the reversible fan module (100) about a line (202) that is orthogonal to the side face (105) and extends through a point at the center of the reversible fan module (100). By rotating (202) the fan module 180° about the line (202), the front side (103) and rear side (104) switch locations. Thus, a reversed reversible fan module (203) causes an air flow in the opposite direction of a reversible fan module (100) before being reversed. Additionally, the two attachment members (106) are located and oriented such that, when reversed, the attachment members (106) occupy the same relative positions and orientations before reversal. Therein, a single set of attachment receptacles may be used to position and orient a reversible fan module (100) within the chassis (not shown) before and after reversal.

Returning to FIG. 1, the reversible fan module (100) also includes a handle (107) disposed on a face opposite the side face (105). The handle enables the reversal process shown in FIG. 2. The handle is aligned with the orthogonal line (202). Rotating the handle (107) by 180° reverses the reversible fan module (100).

The reversible fan module (100) further includes a closing element (108). The closing element (108) prevents a counter air flow, such as an airflow reversal or circulation, when a fan unit (102) becomes inactive. For example, if a fan unit (102) fails due to an internal short or some other cause it may become inactive.

Figure 3:
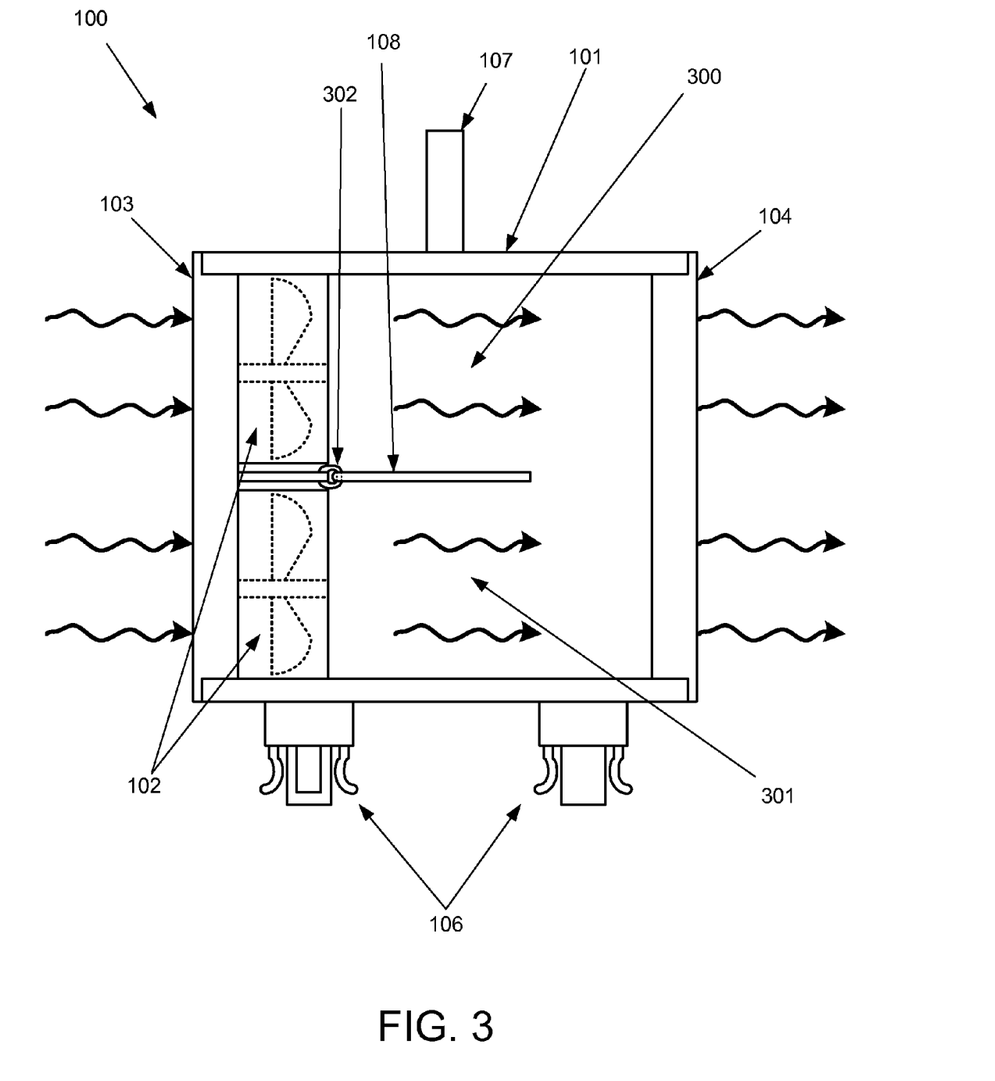
FIG. 3 shows a reversible fan module in accordance with one or more embodiments.

FIG. 3 shows a top view of the reversible fan module (100) in accordance with one or more embodiments of the invention. In addition to showing various features and components of the reversible fan module (100), FIG. 3 also illustrates airflow when all fan units (102) are active. Airflow is indicated by arrows with wavy tails. As seen from the arrows, air flows into the front side (103), through the housing (101), and out of the rear side (104). When inside the housing (101), the airflow is divided into a first sub-airflow and a second sub-airflow, by the closing element (103), that flows through a first housing airflow channel (300) and second housing airflow channel (301), respectively. The closing element (108) is connected to a linkage (302) that is attached to the housing (101). The linkage (101) enables the closing element (108) to rotate about the linkage (108), e.g. as a pivot point. The linkage (101) does not restrict the rotation of the closing element (108) which enables the closing element (108) to rotate according to the flow of air around the closing element. By rotating freely, the closing element (108) is able to prevent the reverse of an air flow or the circulation of an air flow due to an inactive fan unit (102).

In some cases, a reversible fan module (100) may be placed at a location that would naturally lead to a flow of air in the opposite direction as would be caused by the fan units (102). For example, if the rear side (104) was placed in a high air pressure area and the front side (103) was placed in a low pressure area an air flow would naturally occur from the rear side (104) to the front side (103) in the absence of active fan units (102). Accordingly, if a fan unit (102) failed in such an orientation, a reverse airflow or an airflow circulation within the housing (101) may render the reversible fan unit (100) useless. To prevent the reversible fan module (100) from being rendered useless due to an inactive fan unit (102), the closing element (108) is designed to close off a first housing airflow channel (300) or a second housing airflow channel (301). The operation of the closing element (108) is further clarified by way of example in FIGS. 4 and 5 when the reversible fan module (100) is placed at a location that would lead to a reversed airflow without fan unit (102) activity.

Figure 4A:
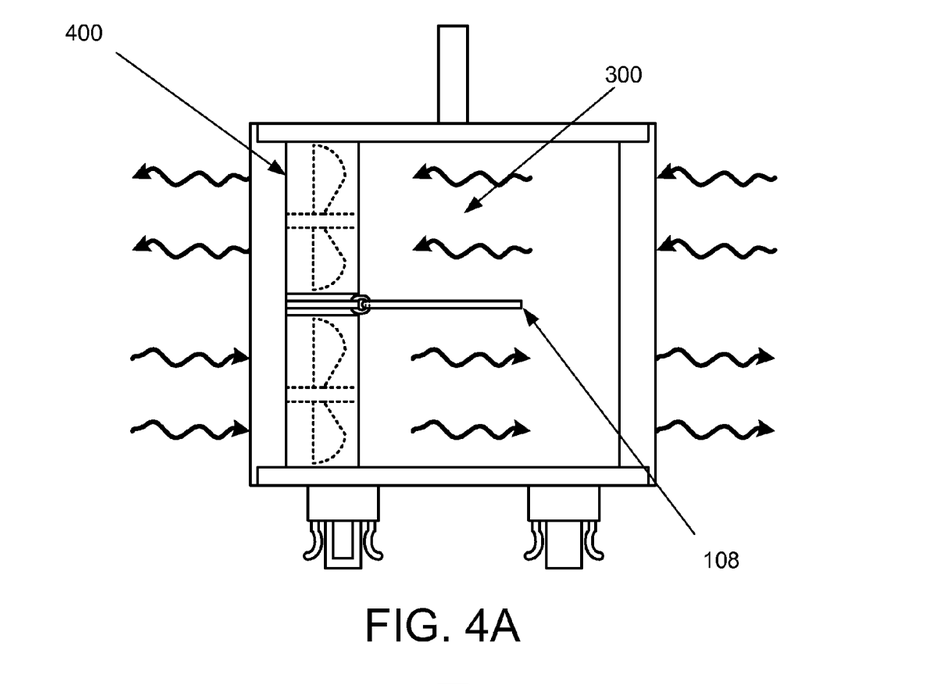
FIGS. 4A-B shows a reversible fan module in accordance with one or more embodiments.
Figure 4B:
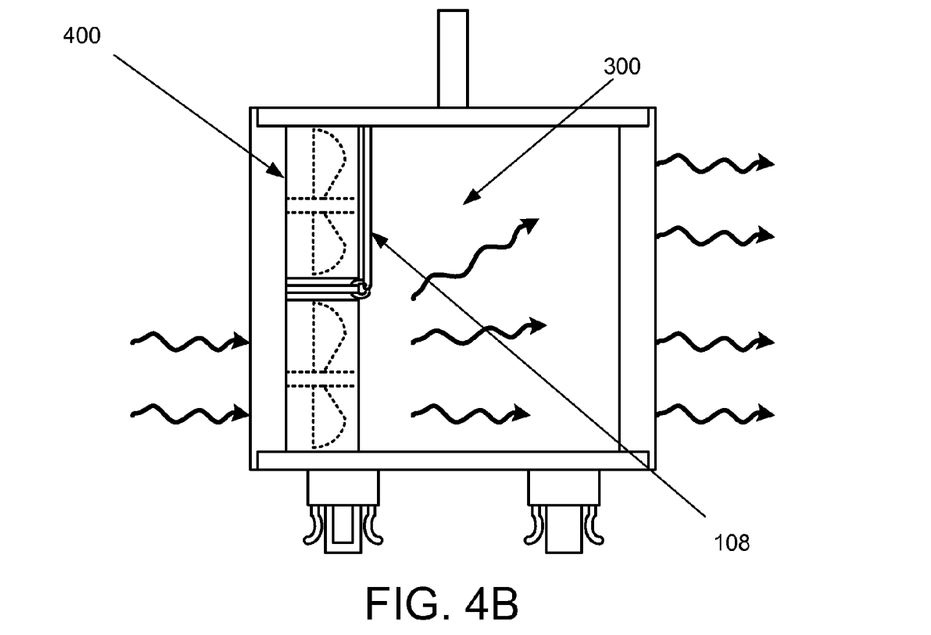

FIG. 4 shows the operation of the closing element (108) when a first fan unit is inactive (400). Specifically, FIG. 4A shows a top view of the reversible fan module (100) immediately after a first fan unit (400) becomes inactive and FIG. 4B shows a top view of the closing member (108) closing off the first housing airflow channel (300) in response to the inactivity of the first fan unit (400). As seen in FIG. 4A, when a first fan unit becomes inactive (400), immediately following the inactivity a counter airflow in the first housing airflow channel (300) may occur.

As seen in FIG. 4B, when a counter airflow occurs in the first housing airflow channel (300) the closing element (108) pivots into the first housing airflow channel (300) and closes it off. By closing off the first housing airflow channel (300), counter airflow is prevented.

Figure 5A:
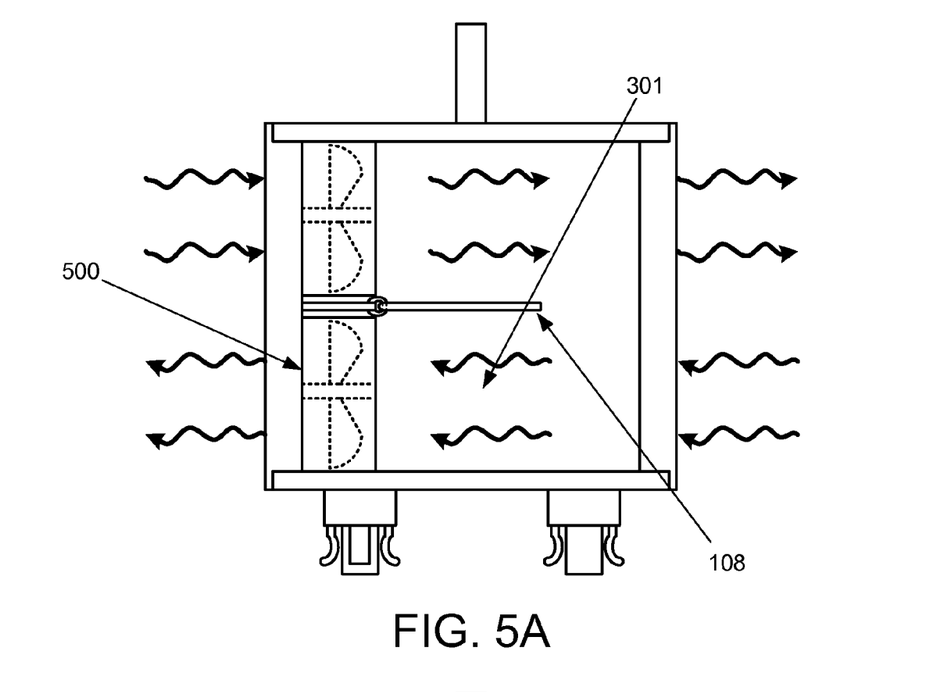
FIGS. 5A-B shows a layered two-dimensional material in accordance with one or more embodiments.
Figure 5B:
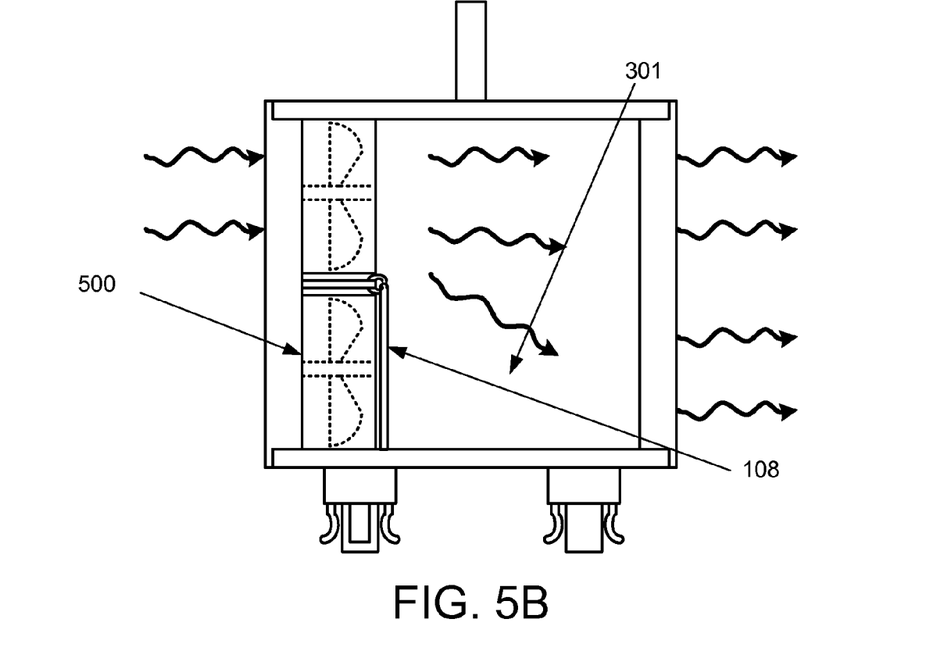

FIG. 5 shows the operation of the closing element (108) when a second fan unit is inactive (500). Specifically, FIG. 5A shows a top view of the reversible fan module (100) immediately after a second fan unit (500) becomes inactive and FIG. 5B shows a top view of the closing member (108) closing off the second housing airflow channel (301) in response to the inactivity of the second fan unit (500). As seen in FIG. 5A, when the second fan unit becomes inactive (500), immediately following the inactivity a counter airflow in the second housing airflow channel (301) may occur.

As seen in FIG. 5B, when the counter airflow occurs in the second housing airflow channel (301) the closing element (108) pivots into the second housing airflow channel (301) and closes it off. By closing off the second housing airflow channel (301), counter airflows are prevented. Thus, the closing element (108) enables multiple fan units (102) to operate as redundant backups without risking impairing the operation of the reversible fan module (100) in the event of inactivity of one of the fan units (102).

Figure 6:
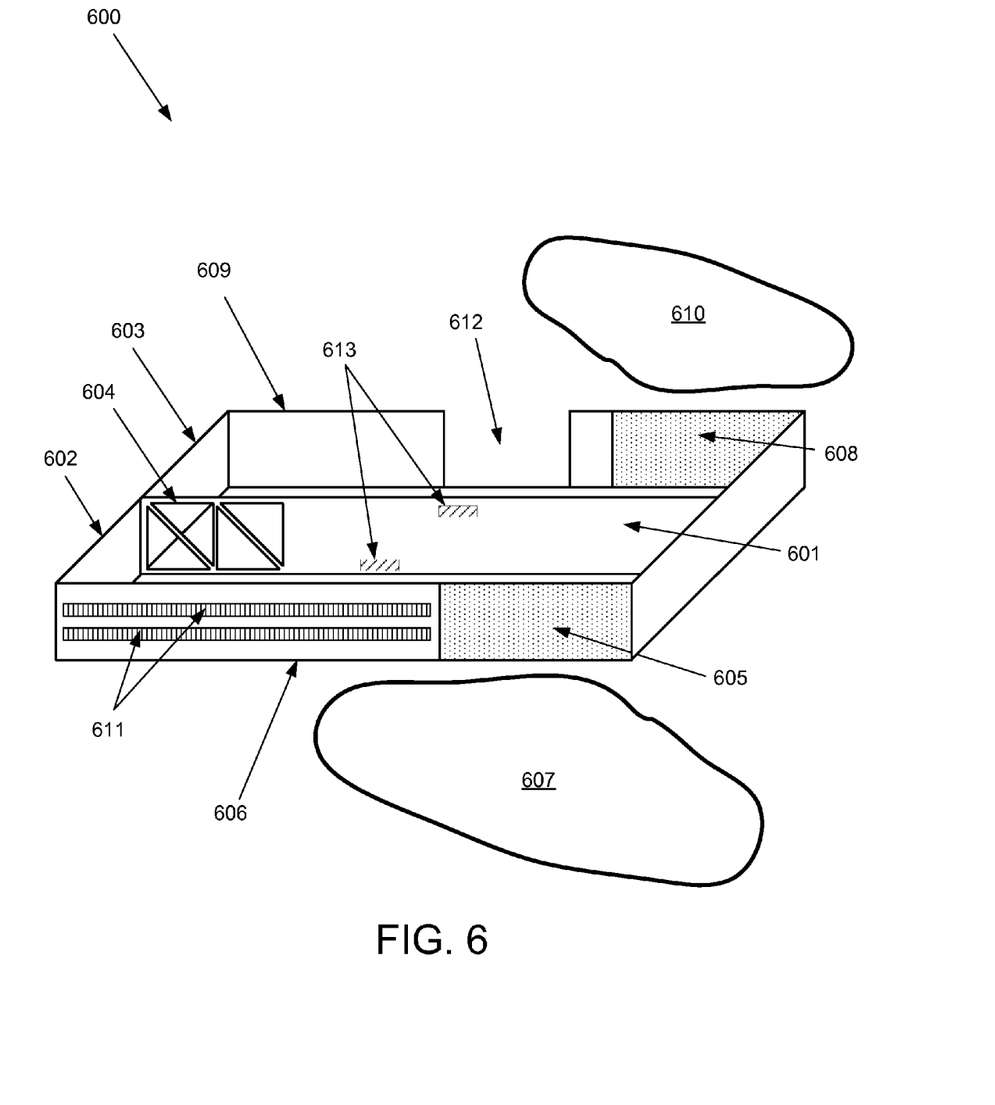
FIG. 6 shows a reversible fan module in accordance with one or more embodiments.

FIG. 6 shows an isometric view of a chassis (600) in accordance with one or more embodiments of the invention. In one or more embodiments, the chassis is used as part of a network switch. In one or more embodiments, the chassis may be used a housing for electrical components such as processors, memory, storage, power supplies, and cooling components. In one or more embodiments, the reversible fan module (100) is used as a cooling component within the network switch.

The chassis (600) includes a dividing wall (601) that divides the internal space of the chassis (600) into a front compartment (602) and a rear compartment (603). The dividing wall (601) includes a window (604) that connects the front compartment (602) to the rear compartment (603). The window (604) is located near one of the ends of the dividing wall (601).

The chassis (600) also includes a first opening (605) on the front side of the chassis (606) that connects the front compartment (602) to a first external region (607). In one or more embodiments of the invention, the first external region (607) is a cold air aisle in a high density computing environment. In one or more embodiments, the first opening (605) is located as far from the window (604) as possible.

The chassis (600) further includes a second opening (608) on the rear side of the chassis (609) that connects the rear compartment (603) to a second external region (610). In one or more embodiments of the invention, the second external region (610) is a hot air aisle in a high density computing environment. In one or more embodiments, the second opening (608) is located as far from the window (604) as possible.

The chassis (600) also include a number of communication ports (611) disposed on the front side of the chassis (600). The communication ports (611) enable electronic components and systems within the chassis (600) to communicate with external communication networks or system.

The chassis (600) also includes a bay (612) adapted to receive a reversible fan module (100). The bay (612) opens to the second external region (610) for insertion and removal of the reversible fan module (100). The bay includes one or more attachment receptacles (613) disposed on the dividing wall (601). The attachment receptacles (613) are located and oriented to mate with the attachment members (106) on the reversible fan module (100). The attachment receptacles (613) are further adapted to position and orient the reversible fan module (100) in the bay (612).

Figure 7:
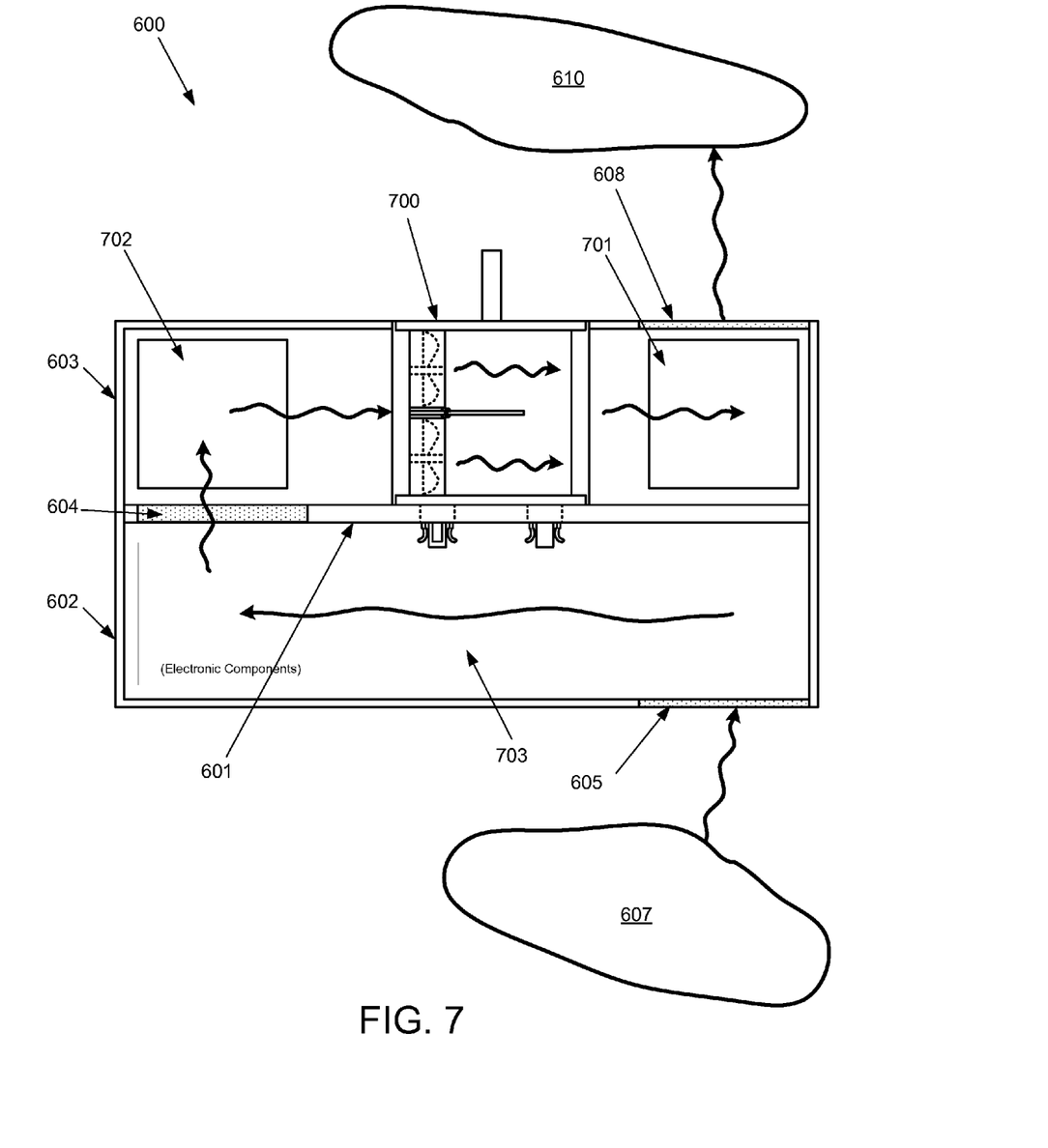
FIG. 7 shows a reversible fan module in accordance with one or more embodiments.

FIG. 7 shows a top view of the chassis in accordance with one or more embodiments of the invention. In addition to showing various features and components of the chassis (600), FIG. 7 also illustrates airflow within the chassis (600) when the reversible fan module (100) is in the bay (612) in a first orientation (700) and the fan units (102) are active. Airflow is indicated by arrows with wavy tails.

In one or more embodiments of the invention, the front compartment (602) houses a number of electrical communication and computation components (703). The communication and computation components (703) may be part of a network switch or any other type of communication device. In FIG. 7, the communication and computation component (703) are drawn as a box within the first compartment (602) for clarity.

In one or more embodiments of the invention, the second compartment (603) houses a first power supply (701) and a second power supply (702). The first power supply (701) and second power supply (702) are disposed on opposite sides of the bay. The first power supply (701) and second power supply (702) are adapted to be cooled by the reversible fan module (100). In one or more embodiments of the invention, neither power supply has its own active cooling element, e.g. a fan, and would overheat if left running without active cooling. The power supplies supply power to the reversible fan module (100) when placed in the bay (612).

As seen from the arrows indicating air flow, when the reversible fan module (100) is in a first orientation (700), an airflow is created that is directed from the first external region (607), through the first opening (605), through the front compartment (602) and across the communication and computation components (703), through the window (604), into the rear compartment (702) and across the second power supply (702), through the reversible fan module (100), into the rear compartment (702) and across the first power supply (701), out of the second opening (608), and into the second external region (610). Thus, only a single airflow channel exists within the chassis (600). When the reversible fan module (100) is located in the bay (612) and active, the reversible fan module (100) generates an airflow that cools the communication and computation components (703) in the front compartment (602), the first power supply (701), and the second power supply (702). Without the airflow generated by the reversible fan module (600), the aforementioned components would overheat and cease to operate. The location of the first opening (605), second opening (608), and window (604) are chosen to create a single airflow path throughout the chassis (600) and, thereby enable cooling of all heat generating components within the chassis (100) by the reversible fan module (100).

Figure 8:
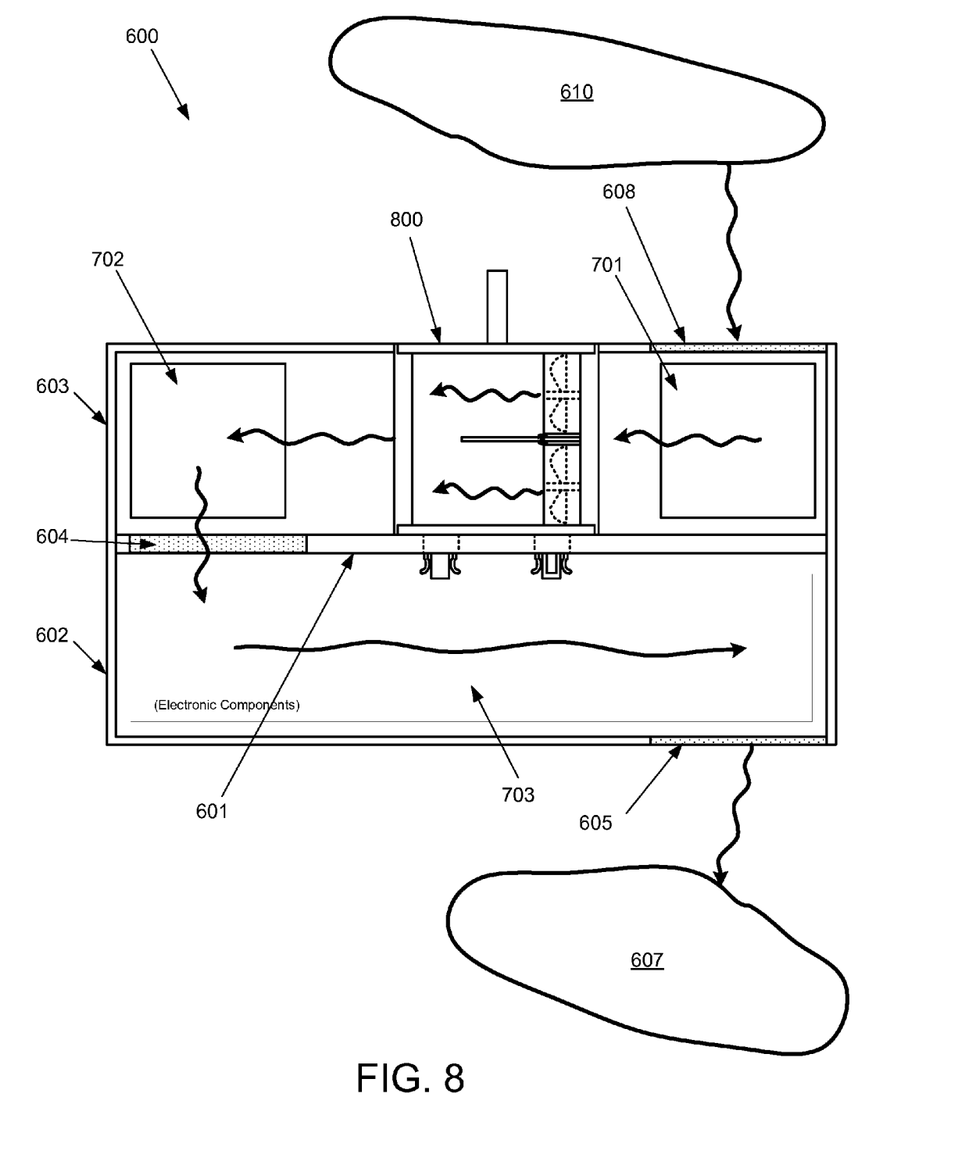
FIG. 8 shows a reversible fan module in accordance with one or more embodiments.

The airflow within the chassis (600) reverses direction when the orientation of the reversible fan module (100) is reversed. FIG. 8 shows a top view of the chassis (100) after reversing the orientation of the reversible fan module (100) in accordance with one or more embodiments of the invention. In addition to showing various features and components of the chassis (600), FIG. 8 also illustrates airflow within the chassis (600) when the reversible fan module (100) is in the bay (612) in a second orientation (800) and the fan units (102) are active. Airflow is indicated by arrows with wavy tails.

As seen from the arrows indicating air flow, when the reversible fan module (100) is in a second orientation (800), an airflow is created that is directed from the second external region (610), through the second opening (610), through the rear compartment (603) and across the first power supply (701), through the reversible fan module (100), through the rear compartment (702) and across the second power supply (702), through the window (604), through the front compartment (602), out of the first opening (605), and into the first external region (607). Thus, when in a second orientation (800), the reversible fan module (100) creates and airflow that cools the communication and computation components (703), first power supply (701), and second power supply (702).

Figure 9:
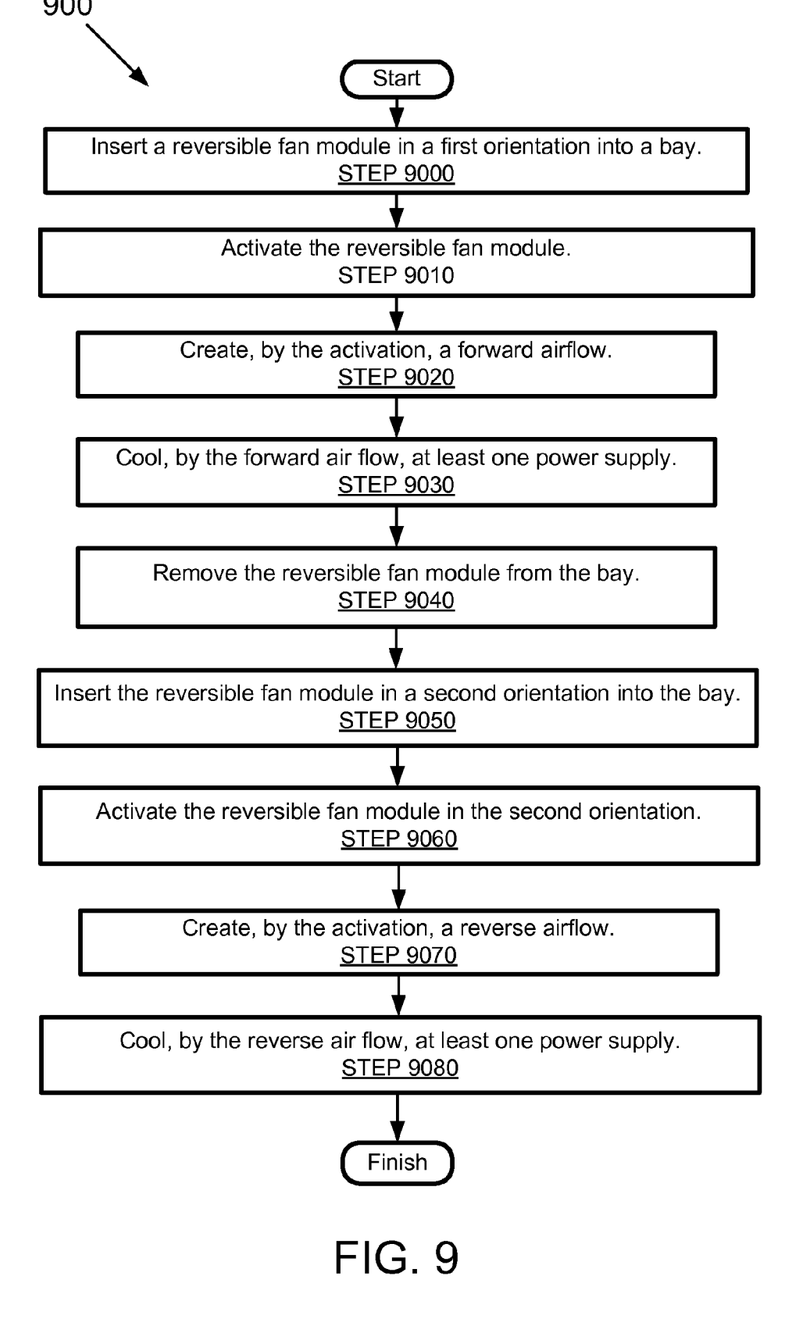
FIG. 9 shows a method in accordance with one or more embodiments.

FIG. 9 shows a flowchart (900) according to one or more embodiments of the invention. The method depicted in FIG. 9 may be used to reverse the flow of air in a chassis in accordance with one or more embodiments of the invention. One or more steps shown in FIG. 9 may be omitted, repeated, and/or performed in a different order among different embodiments.

At Step 9000, a reversible fan module (100) is inserted in a first orientation (700) in a bay (612) in a chassis (600). In one or more embodiments of the invention, insertion of the reversible fan module (100) connects the reversible fan module (100) to one or more power supplies housed in the chassis (600).

At Step 9010, the reversible fan module (100) is activated. Activation of the reversible fan module (100) causes the fan units (102) within the reversible fan module (100) to activate, which creates an airflow inside the reversible fan module (100

At Step 9020, an airflow within the chassis (600) is created in response to the activation of the reversible fan module (100). In one or more embodiments, the chassis (100) includes a single airflow path and the reversible fan module (100) is in-line with the path. In one or more embodiments of the invention, the created airflow is directed from the first external region (607), through the first opening (605), through the front compartment (602), and across the communication and computation components (703), through the window (604), into the rear compartment (702) and across the second power supply (702), through the reversible fan module (100), into the rear compartment (702) and across the first power supply (701), out of the second opening (608), and into the second external region (610).

At Step 9030, at least one power supply is cooled by the created airflow. In one or more embodiments, the created airflow cools a first power supply (701) and a second power supply (702). In one or more embodiments, neither the first power supply (701) nor the second power supply (702) include an active cooling element and would overheat in normal use unless cooled by an airflow created by the reversible fan module (100).

At Step 9040, the reversible fan module (100) is removed from the chassis (100). In one or more embodiments, removal of the reversible fan module (100) terminates an airflow within the chassis (100) that cools at least one power supply.

At Step 9050, the orientation of the reversible fan module (100) is reversed as shown in FIG. 2 and inserted into the bay (912) in the chassis (100) in a second orientation. In one or more embodiments of the invention, insertion of the reversible fan module (100) in the second orientation connects the reversible fan module (100) to one or more power supplies housed in the chassis (600).

At Step 9060, the reversible fan module (100) in the second orientation is activated. Activation of the reversible fan module (100) in the second orientation causes the fan units (102) within the reversible fan module (100) to activate which creates an airflow inside the reversible fan module (100).

At Step 9070, a reverse airflow within the chassis (600) is created in response to the activation of the reversible fan module (100) in the second orientation. In one or more embodiments of the invention, the created airflow is directed from the second external region (610), through the second opening (610), through the rear compartment (603) and across the first power supply (701), through the reversible fan module (100), through the rear compartment (702), and across the second power supply (702), through the window (604), through the front compartment (602), out of the first opening (605), and into the first external region (607).

At Step 9080, at least one power supply is cooled by the created reverse airflow. In one or more embodiments, the created reverse airflow cools a first power supply (701) and a second power supply (702). In one or more embodiments, neither the first power supply (701) nor the second power supply (702) include an active cooling element and would overheat in normal use unless cooled by the reverse airflow created by the reversible fan module (100) in the second orientation.

A reversible fan module according to one or more embodiments may prevent counter airflow due to inactivity of a fan unit within the reversible fan module. Thus, the reversible fan module may provide a redundant cooling system capable of continuing to supply a cooling airflow to electronic components in the event of a failure of a fan module. Moreover, the reversible fan module may provide a mechanism to prevent reverse or circulation of airflow in the event of failure of a fan unit. Further, one or more embodiments of the invention, the system also allows for reduced numbers of active cooling units by creating a single airflow path throughout the chassis. Thus, a single active cooling unit such as the reversible fan module may cool all of the active components in the chassis. Further, embodiments of the invention allows for a single fan module to generate to different airflow paths.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:
1. A system, comprising:
a reversible fan module that creates an airflow, comprising:
a set of attachment members, disposed on a face of the reversible fan module, adapted to secure the reversible fan module in one selected from a group consisting of a first orientation and a second orientation,
a chassis, comprising:
a divider that divides an interior region of the chassis into a front compartment and a rear compartment,
a window, disposed on the divider, that allows airflow between the front compartment and the rear compartment,
a first opening in the chassis that opens the front compartment to a first external region,
a second opening in the chassis that opens the rear compartment to a second external region,
a bay adapted to receive the reversible fan module,
a first power supply module, disposed in the rear compartment, adapted to be cooled by at least one selected from a group consisting of a forward airflow and a reverse air flow,
a second power supply module, disposed in the rear compartment, adapted to be cooled by at least one selected from the group consisting of the forward airflow and the reverse air flow, and
a set of attachment receptacles adapted to mate with the set of attachment members,
wherein when the reversible fan module is received in the first orientation, the forward airflow is directed into the first opening, through the front compartment, into the rear compartment, through the second power supply module, through the reversible fan module, through the first power supply module, and out of the second opening, wherein when the reversible fan module is received in the second orientation, the reverse airflow is directed into the second opening, into the rear compartment, through the first power supply module, through the reversible fan module, through the second power supply module, into the front compartment, and out of the first opening.

2. The system according to claim 1, wherein the reversible fan module further comprises:
at least two fan units,
a sub-air channel associated with one of the at least two fan units, and
an airflow activated closing element that closes the sub-air channel in response to a counter airflow.

3. The system according to claim 2, wherein the counter airflow occurs in response to an inactivity of the one of the at least two fan units.

4. The system according to claim 1, wherein the reversible fan module is powered by at least one selected from a group consisting of the first power supply module and the second power supply module when in the bay.

5. The system according to claim 1, wherein the location of the first opening on the front side, the location of the window on the divider, and the location of the second opening on the rear side cause the forward airflow and the reverse airflow to cool the front compartment and the rear compartment.

6. The system of claim 1, wherein the system is a network device.

7. A method of reversing the flow of air in a chassis, comprising:
inserting a reversible fan module in a first orientation in a bay of a chassis comprising a single airflow path;
activating the reversible fan module when the reversible fan module is in the first orientation;
causing, by the activated reversible fan module in the first orientation, a forward airflow in a first direction along the single airflow path, wherein the forward airflow cools at least one power supply module that supplies power to the reversible fan module;
removing the reversible fan module from the bay;
inserting the reversible fan module in a second orientation in the bay;
activating the reversible fan module when the reversible fan module is in the second orientation; and
causing, by the activated reversible fan module in the second orientation, a reverse airflow in a second direction along the single airflow path, wherein the reverse airflow cools at least one power supply module that supplies power to the reversible fan module.

8. The method of claim 7, wherein the forward airflow and reverse airflow are perpendicular to a removal direction of the reversible fan module.

9. A reversible fan module, comprising:
a set of attachment members, disposed on a face of the reversible fan module, adapted to secure the reversible fan module in one selected from a group consisting of a first orientation and a second orientation,
at least two fan units that cause a forward airflow when the reversible fan module is in the first orientation and a reverse airflow when the reversible fan module is in the second orientation,
a sub-air channel associated with one of the at least two fan units, and
an airflow activated closing element that closes the sub-air channel in response to a counter airflow.

10. The reversible fan module of claim 9, further comprising:
a handle disposed on a side of the reversible fan module opposite of the set of attachment members.

11. The reversible fan module of claim 9, wherein the at least two fan units are adapted to receive power from an external power supply.

* * * * *